United States Patent
Palaniswamy et al.

(10) Patent No.: US 10,692,843 B2
(45) Date of Patent: Jun. 23, 2020

(54) FLEXIBLE LIGHT EMITTING SEMICONDUCTOR DEVICE WITH LARGE AREA CONDUIT

(71) Applicant: 3M INNOVATIVE PROPERTIES COMPANY, St. Paul, MN (US)

(72) Inventors: Ravi Palaniswamy, Singapore (SG); Jian Xia Gao, Singapore (SG); Alejandro Aldrin A. Narag, II, Singapore (SG); Nathan P. Kreutter, Austin, TX (US); Andrew J. Ouderkirk, St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 71 days.

(21) Appl. No.: 15/032,770

(22) PCT Filed: Dec. 2, 2014

(86) PCT No.: PCT/US2014/068167
§ 371 (c)(1),
(2) Date: Apr. 28, 2016

(87) PCT Pub. No.: WO2015/084851
PCT Pub. Date: Jun. 11, 2015

(65) Prior Publication Data
US 2016/0276319 A1    Sep. 22, 2016

Related U.S. Application Data

(60) Provisional application No. 61/911,537, filed on Dec. 4, 2013.

(51) Int. Cl.
*H01L 33/64* (2010.01)
*H01L 25/075* (2006.01)
(Continued)

(52) U.S. Cl.
CPC .......... *H01L 25/0753* (2013.01); *H01L 33/62* (2013.01); *H01L 33/642* (2013.01);
(Continued)

(58) Field of Classification Search
CPC ....... H01L 2924/00; H01L 2224/48091; H01L 2924/01322; H01L 2924/01327;
(Continued)

(56) References Cited

U.S. PATENT DOCUMENTS

| | | |
|---|---|---|
| 6,857,767 B2 | 2/2005 | Matsui |
| 7,648,257 B2 | 1/2010 | Villard |

(Continued)

FOREIGN PATENT DOCUMENTS

| | | |
|---|---|---|
| CN | 2014-12704 | 2/2010 |
| JP | 2009-4129 | 1/2009 |

(Continued)

OTHER PUBLICATIONS

International Search report for PCT International Application No. PCT/US2014/068167 dated Mar. 28, 2015, 5 pages.

*Primary Examiner* — Edward Chin
(74) *Attorney, Agent, or Firm* — Clifton F. Richardson (57) ABSTRACT

A flexible polymeric dielectric layer (12) having first and second major surfaces, the first major surface having a conductive layer (20) thereon, the dielectric layer having at least one conduit (10) extending from the second major surface to the first major surface, the conduit having at least one lateral dimension of at least about one centimeter and being at least partially filled with conductive material (18), the conductive layer including at least one conductive feature (21) substantially aligned with the conduit (10), the conductive feature (21) supporting a plurality of light emitting semiconductor devices (22).

19 Claims, 4 Drawing Sheets

(51) Int. Cl.
*H05K 1/18* (2006.01)
*H05K 1/02* (2006.01)
*H01L 33/62* (2010.01)

(52) U.S. Cl.
CPC ......... *H01L 33/644* (2013.01); *H05K 1/0206* (2013.01); *H05K 1/189* (2013.01); *H01L 33/64* (2013.01); *H01L 2224/48091* (2013.01); *H01L 2224/48137* (2013.01); *H01L 2224/49176* (2013.01); *H05K 2201/09827* (2013.01); *H05K 2201/10106* (2013.01); *H05K 2203/049* (2013.01)

(58) Field of Classification Search
CPC . H01L 2924/12032; H01L 2924/12041; H01L 2924/12042; H01L 2924/15747; H01L 2924/15787; H01L 2924/181; H01L 2924/351
USPC .................................. 174/252, 254; 361/762
See application file for complete search history.

(56) References Cited

U.S. PATENT DOCUMENTS

| | | | |
|---|---|---|---|
| 7,821,023 | B2 | 10/2010 | Yuan |
| 7,959,325 | B2 | 6/2011 | Roberts |
| 9,716,061 | B2 * | 7/2017 | Palaniswamy .... H01L 23/49872 |
| 9,978,582 | B2 * | 5/2018 | Batinica ............ H01L 21/02035 |
| 2003/0072153 | A1 | 4/2003 | Matsui |
| 2005/0116235 | A1 | 6/2005 | Schultz |
| 2006/0087866 | A1 | 4/2006 | Ng |
| 2007/0063213 | A1 | 3/2007 | Hsieh |
| 2007/0080438 | A1 | 4/2007 | Yamanaka |
| 2007/0115671 | A1 | 5/2007 | Roberts |
| 2007/0120089 | A1 | 5/2007 | Mao |
| 2007/0247847 | A1 | 10/2007 | Villard |
| 2008/0067526 | A1 | 3/2008 | Chew |
| 2008/0117619 | A1 | 5/2008 | Pang |
| 2008/0144322 | A1 | 6/2008 | Norfidathul |
| 2008/0225523 | A1 | 9/2008 | De Samber |
| 2009/0050908 | A1 | 2/2009 | Yuan |
| 2012/0002420 | A1 | 1/2012 | Imai |
| 2013/0258658 | A1 | 10/2013 | Hussell |
| 2013/0320390 | A1 * | 12/2013 | Palaniswamy .... H01L 23/49872 257/99 |
| 2014/0036461 | A1 * | 2/2014 | Palaniswamy ........ H01L 33/486 361/762 |
| 2016/0276319 | A1 * | 9/2016 | Palaniswamy ...... H01L 25/0753 |

FOREIGN PATENT DOCUMENTS

| | | |
|---|---|---|
| TW | 2008-47481 | 12/2008 |
| WO | WO 2012-061010 | 5/2012 |
| WO | WO 2012-061183 | 5/2012 |
| WO | WO 2012-112873 | 8/2012 |
| WO | WO 2012112873 A2 * | 8/2012 ............. H01L 33/62 |
| WO | WO-2012112873 A2 * | 8/2012 ............. H01L 33/62 |

* cited by examiner

FLEXIBLE LIGHT EMITTING SEMICONDUCTOR DEVICE WITH LARGE AREA CONDUIT

TECHNICAL FIELD

This invention relates to flexible high power light emitting semiconductor devices.

BACKGROUND

Conventional light emitting semi-conductor (LES) devices (LESDs), including light emitting diodes (LEDs) and laser diodes, and packages containing LESDs have several drawbacks. High power LESDs generate a substantial amount of heat that must be managed. Thermal management deals with problems arising from heat dissipation and thermal stresses, which is currently a key factor in limiting the performances of light-emitting diodes.

In general, LES devices are commonly prone to damage caused by, e.g., a buildup of trapped heat generated from within the devices. Excessive heat buildup can cause deterioration of the materials used in the LES devices, such as encapsulants for the LESDs, which can shorten the life of the LESD. When LESDs are attached to flexible-circuit laminates, which may also include other electrical components, the heat dissipation problems are greatly increased.

Additionally, conventional LES devices and packages tend to be thick, which limits their uses in low form factor applications. Consequently, there is a continuing need to improve the design of flexible LES devices and packages to improve their thermal dissipation properties, as well as to allow for their use in low form factors.

SUMMARY

At least one aspect of the present invention provides a cost-effective thermal management solution for current and future high power LESD constructions through a robust flexible LESD construction. The ability to dissipate large amounts of heat is typically needed for the operation of high power LESD arrays. According to at least one embodiment of the present invention, heat dissipation can be managed by integrating the LESDs into a system having a flexible polymeric dielectric substrate, i.e., a dielectric layer. To accomplish better heat management, LESDs are positioned so they are in close or direct thermal contact with thermally conductive layers. In at least one embodiment of the present invention, controlled removal, e.g., by etching, of the dielectric substrate to create an opening completely through the dielectric substrate to form a conduit, is performed.

At least one embodiment of the present invention provides an article comprising a flexible polymeric dielectric layer having first and second major surfaces, the first major surface having a conductive layer thereon, the dielectric layer having at least one conduit extending from the second major surface to the first major surface, the conduit having at least one lateral dimension of at least about one centimeter and being at least partially filled with conductive material, the conductive layer including at least one conductive feature substantially aligned with the conduit, the conductive feature configured to support a plurality of light emitting semiconductor device.

As used in this application:

"array" means an arrangement of a plurality of elements;

"conductive" means thermally, and optionally electrically, conductive unless otherwise indicated;

"LES" means light emitting semiconductor(s), including light emitting diode(s) and laser diode(s); and "LESD" means light emitting semiconductor device(s), including light emitting diode device(s) and laser diode device(s). An LESD may be a bare LES die construction, a complete packaged LES construction, or an intermediate LES construction comprising more than the bare die, but less than all the components for a complete LES package, such that the terms LES and LESD may be used interchangeably and refer to one or all of the different LES constructions. The term "flexible LES device" or "flexible LESD" typically refers to the flexible article containing the bare die light emitting semiconductor, packaged LES construction, or intermediate LES construction. Examples of the type of complete packaged LES constructions that may be suitable for use in embodiments of the present invention Golden DRAGON LEDs, available from OSRAM Opto Semiconductors GmbH, Germany; LUXION LEDs, available from Philips Lumileds Lighting Company, USA; and XLAMP LEDs, available from Cree, Inc., USA.

An advantage of at least one embodiment of the present invention is:

The LESDs on the flexible dielectric substrate may be electrically connected in series, in parallel, or individually depending on the desired application.

The dielectric layer removal may be achieved using wet chemistries, excimer laser ablation, plasma etching, or punching.

The flexible substrate provides great flexibility and bendability for the LESD articles.

The flexible LES devices provide excellent heat dissipation, which is typically needed for high power LESDs.

The flexible LES devices can be wired as an array on a single flexible and insulating layer.

The resulting flexible LES devices can be bent in simple or compound curves.

The resulting flexible LES devices can provide a robust, cost-effective thermal management solution for current and future high power LESD constructions.

Using the article of the present invention with a discrete LESD can reduce the overall thermal resistance of a light emitting device.

The conduits of the present invention containing conductive material provide excellent Z-axis thermal conductivity.

The size of the conduits and the surface area of the conductive layers can be tailored to provide optimized thermal resistance values.

The above summary of the present invention is not intended to describe each disclosed embodiment or every implementation of the present invention. The Figures and detailed description that follow below more particularly exemplify illustrative embodiments.

DETAILED DESCRIPTION

In the following description, reference is made to the accompanying set of drawings that form a part of the description hereof and in which are shown by way of illustration several specific embodiments. In general similar reference numbers are used for similar features in the various embodiments. Unless indicated otherwise, these similar features may comprise the same materials, have the same attributes, and serve the same or similar functions. Additional or optional features described for one embodiment may also be additional or optional features for other embodiments, even if not explicitly stated, where appropriate. It is to be understood that other embodiments are contemplated and may be made without departing from the scope or spirit of the present invention. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Unless otherwise indicated, the terms "coat," "coating," "coated," and the like are not limited to a particular type of application method such as spray coating, dip coating, flood coating, etc., and may refer to a material deposited by any method suitable for the material described, including deposition methods such vapor deposition methods, plating methods, coating methods, etc. In addition, directional terminology, such as "top," "bottom," "front" "back," "above," "below," etc., is used with reference to the orientation of the Figure(s) being described. Because components of embodiments can be positioned in a number of different orientations, the directional terminology is used for purposes of illustration and is in no way limiting.

Figure 1A:
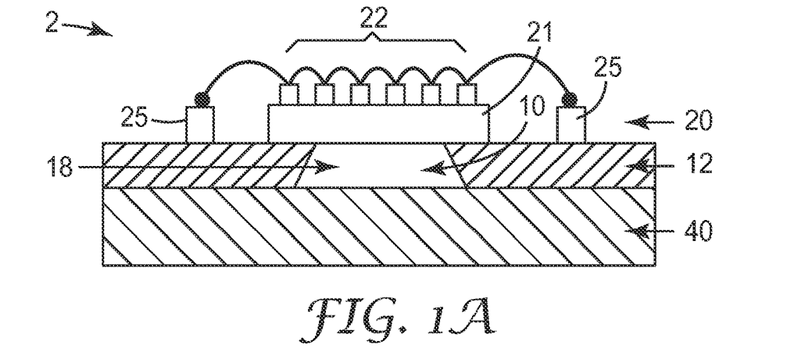
FIG. 1A is a schematic cross-sectional view and FIG. 1B is a top view of an exemplary embodiment of a flexible LESD according to an aspect of the present invention.
Figure 1B:
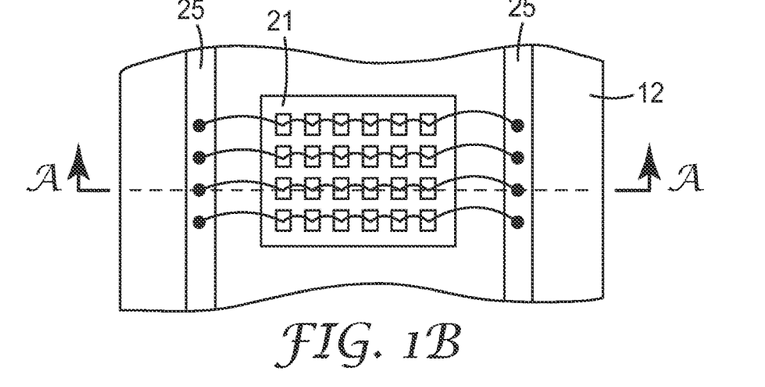

At least one embodiment of a flexible LESD 2 of the present invention is illustrated in FIGS. 1A (cross-section) and 1B (top view), which shows a flexible dielectric layer 12 having at least one conduit 10 filled with conductive material 18. Conduit 10 extends all the way through dielectric layer 12 and may be any suitable shape, e.g., circular, oval, rectangular, serpentine, a channel, a grid (e.g., forming islands of dielectric layer separated by a continuous pattern of overlapping channels), etc. The flexible dielectric layer 12 has first and second major surfaces. Conductive layer 20 is disposed on the first major surface of dielectric layer 12 and may be patterned to include a conductive feature 21, which may be electrically isolated from other electrically conductive elements if it is electrically conductive, on which LESDs 22 are disposed in an array. LESDs 22 can be attached, directly, or indirectly, to conductive feature 21 using a known die bonding method such as eutectic, solder, adhesive, and fusion bonding. LESDs 22 may be wire bonded in series (or in parallel) to electrically conductive pads 25, which may be part of an electrically conductive circuit or may comprise material different from that of the conductive circuit, such as Au, AuSn, AuGe, or other suitable materials, which material is electrically connected to a conductive circuit. In some embodiments, a passivation or bonding layer is located beneath LESDs 22 to facilitate bonding LESDs 22 to an underlying layer. In at least one embodiment, conductive substrate 40 is attached to the flexible LES device adjacent the second major surface of dielectric layer 12, which brings it into contact with the conductive material 18 in conduit 10. Conductive substrate 40 may be any material that is thermally conductive. For example, conductive substrate may be a metal strip, e.g., of copper or aluminum, a heat sink, or other heat transferring or heat absorbing material. Conductive substrate 40 may be attached to the flexible LES device using a thermally conductive adhesive. The juxtaposition of conductive feature 21, conductive material 18 in conduit 10, and conductive substrate 40 allows for efficient dissipation of heat generated by the LESDs to conductive substrate 40. In addition, the conductive material 18 in conduit 10 can provide mechanical support for conductive feature 21, which is essentially suspended over the opening of conduit 10.

While a single conduit is described in this embodiment, the flexible LES device may comprise an array of conduits, at least one of which supports a conductive feature. The conduits of the present invention are substantially larger than state of the art vias, which are in the nanometer to lower micrometer size range. In contrast to vias, the conduits of the present invention have at least one lateral dimension in the range, i.e., one or more centimeters. A lateral dimension is a dimension measured parallel (in the x or y direction) to the plane of the substrate in which the conduit is located. For example, the diameter, width, or length of a conduit is a lateral dimension. In at least one embodiment of the present invention, at least one conduit has at least one lateral dimension of at least 1 cm. In at least one other embodiment, at least one conduit has at least one lateral dimension of at least 2 cm. In other embodiments, at least one conduit has at least one lateral dimension of at least 3 cm, at least 4 cm, and up to, and including, 5 cm. In some embodiments, at least one conduit may have at least one lateral dimension that is greater than 5 cm.

The conductive features and underlying conduits may support any number of LESDs, which may be connected in series or in parallel and may have two top contacts or top and bottom contacts. When the LESDs are wire bonded to each other, then to a circuit trace adjacent the conductive feature, such as is illustrated in FIGS. 1A, 1B, and 2, the conductive feature and underlying conduit can form an essentially solid mass of thermally conductive material, which can effectively move heat away from the LESs located on the conductive feature.

At least some embodiments of the present invention have conduits with sloped side walls. In some instances these may be preferred because, e.g., for a given thickness of dielectric layer and a given conduit diameter nearest a conductive feature, a conduit having sloped side walls can contain more material than a conduit having 90° side walls. For example, the opening of a conduit adjacent a conductive feature typically will be limited by the size of that conductive feature; however, by employing sloped conduit side walls, the opening at the opposing end of the conduit may be enlarged to an optimum size such that the conduit can contain a larger amount of conductive material (to transfer more heat away from the LESD) and the conductive material at this opening will have a large surface area that can interface more effectively with a heat transferring or absorbing material which may be attached to the dielectric layer and conductive material in the conduits.

Another advantage of sloped side walls is that, when a conduit is filled with conductive material, it bonds to the portion of any conductive feature covering an opening of the conduit. If the conduit walls are sloped, a wedge-shaped portion of dielectric layer around the circumference of the conduit is trapped between the conductive material in the conduit and the conductive feature on the first major surface of the dielectric layer. This trapped wedge helps prevent the conductive material in the conduit from dislodging when the dielectric material is bent and flexed.

Figure 2:
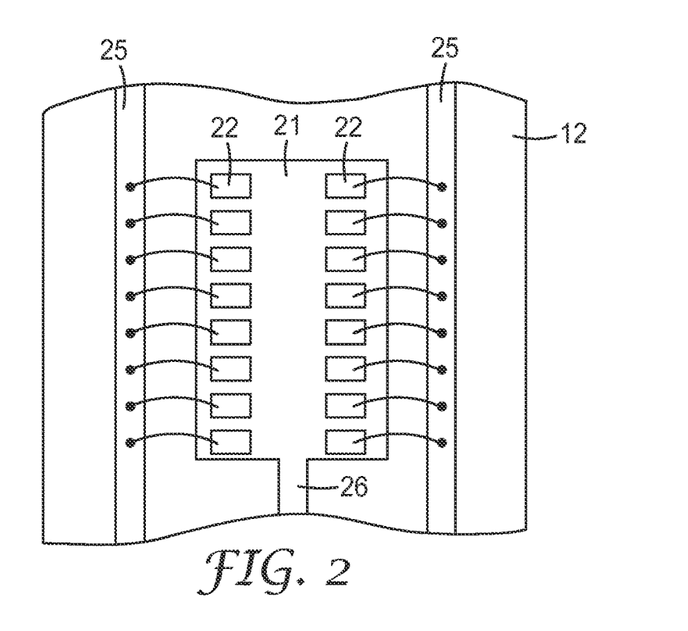
FIG. 2 is a top view of an exemplary embodiment of a flexible LESD according to an aspect of the present invention.
Figure 3A:
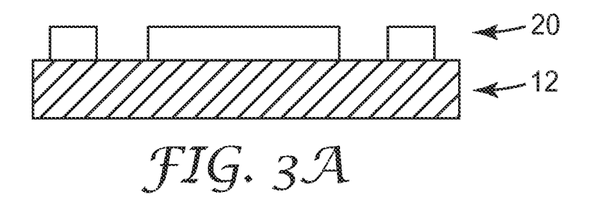
FIGS. 3A-3E and 3E' are schematic cross-sectional views of an exemplary process for preparing a flexible LESD of the present invention.
Figure 3B:
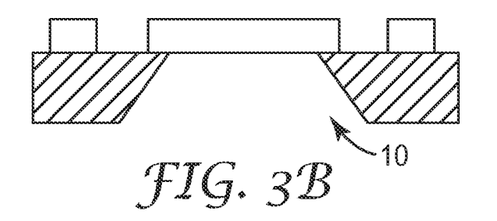
Figure 3C:
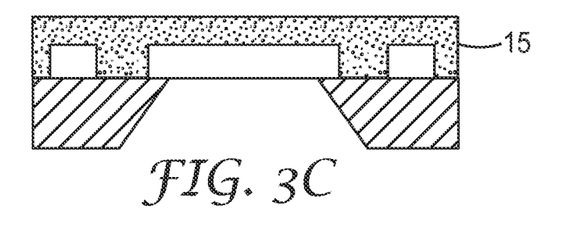
Figure 3D:
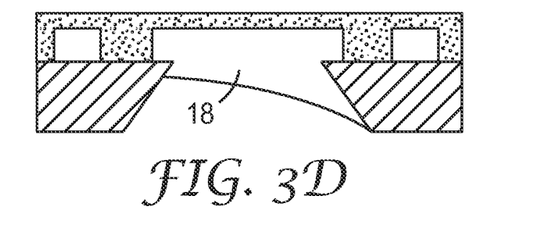
Figure 3E:
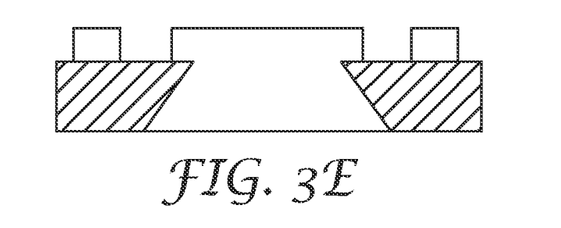

FIG. 2 illustrates an embodiment of a flexible LESD 2 of the present invention in which LESDs 22 each have one top contact and one bottom contact. The top contacts are wire bonded in parallel to conductive pads 25. The bottom contacts are connected to conductive feature 21, which is connected to electrically conductive trace 26. pad FIGS. 3A through 3E show a method of making at least one embodiment of the present invention in which conductive layer 20 is electrically conductive. Because the conduits are so large, when the conduits 10 are filled with conductive material 18, it can be difficult to obtain an even surface. The inventors have developed a process that provides an even surface. Conductive layer 20 is created and patterned on a first side of flexible dielectric layer 12 (FIG. 3A), which has first and second major surfaces and first and second side edges. Then conduit 10 (or multiple conduits) is (are) formed in flexible dielectric layer 12, extending from a second side to the first side of flexible dielectric layer 12 (FIG. 3B), thereby exposing a portion of the surface of conductive layer adjacent the first major surface of the dielectric layer. A photoresist mask 15 is applied over conductive layer 20, except for the portion exposed by conduit 10 (FIG. 13C). One or more electrical contacts are attached to the conductive layer 20 proximate a first side edge of the dielectric layer, then electroplating of the portion of the surface of conductive layer 20 exposed by the conduit 10 is initiated. Because the conduits are large, the portions of the conduits closest to the electrical contacts plate up faster than the portions further away. To accommodate this uneven deposition, after the conduit has been filled about half way (FIG. 3D), the electrical contacts are removed from the conductive layer proximate the first side edge of the dielectric layer and are attached to the conductive layer proximate a second side edge of the dielectric layer, then the electroplating process is continued until the conduit is filled to the desired level. In this manner, the variation in final thickness of the conductive material 18 filling the conduit 10 can be maintained at or about 10-15% of the total thickness of the conductive material in the conduit 10. The photoresist layer is then removed (FIG. 3E). Other methods may also be used to fill the conduits with conductive material. The added conductive material may fill the conduit to any suitable level, e.g., 100%, 75%, 50%, 25%, etc. A level of 100% is typically preferred to maximize heat transfer.

In some embodiments, the conduit may be filled to a level greater than 100% (FIG. 3E') such that the conductive material protrudes from the second surface of the substrate. This may further enhance heat transfer. In some embodiments, an adhesive layer 35 such as an adhesive thermal interface material (TIM) is used to attach the LESD to a thermally conductive substrate 40, such as a heat sink. The conductive material 18 typically has higher thermal transfer properties than an adhesive material such as a TIM. Therefore, minimizing the amount of less thermally conductive material (such as a TIM or conductive adhesive), such as occurs between the protruding portion of conductive material 18 and an opposing conductive substrate 40, will allow for more heat to be transferred away from the LESDs. This can be accomplished by, e.g., using a conformable material for adhesive layer 35 to attach the LESD to the conductive substrate 40.

Figure 4:
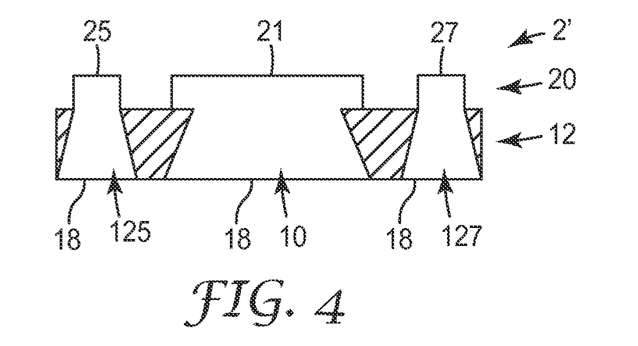
FIG. 4 is a schematic cross-sectional view of an exemplary embodiment of a flexible LESD according to an aspect of the present invention.

FIG. 4 illustrates another embodiment of the present invention. The article illustrated in FIG. 4 is similar to the article of FIG. 3E except that it has two additional conduits 125 and 127 extending through dielectric layer 12 beneath conductive pads 25 and 27, that are filled with conductive material 18, which may be, but is not limited to, copper or other conductive materials. In at least some embodiments, these additional conduits are thermally and electrically conductive and can act as both electrodes and heat transfer channels.

Figure 5:
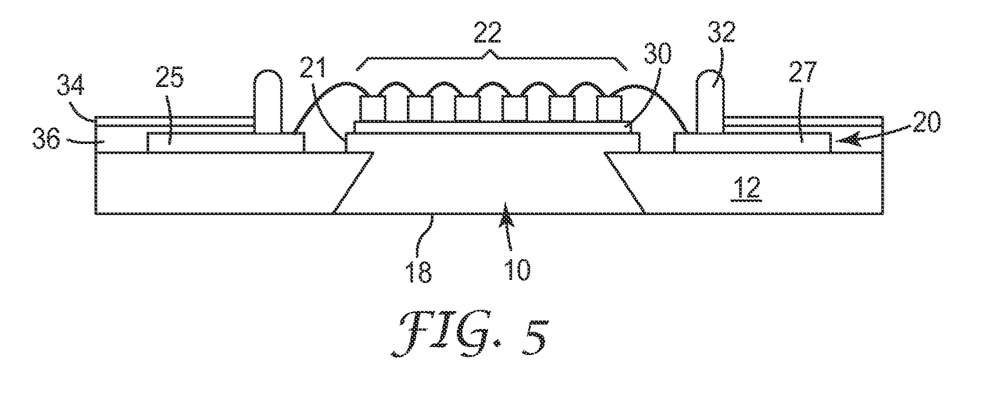
FIG. 5 is a schematic cross-sectional view of an exemplary embodiment of a flexible LESD according to an aspect of the present invention.

FIG. 5 is an alternate embodiment of a flexible LESD 2. In this embodiment, conductive pads 25, 27 are larger. Additionally, reflective layer 30 is located between conductive feature 21 and LESDs 22. Reflective layer 30 preferably comprises a reflective, thermally conductive material. A suitable material may be silver or other reflective metals or alloys. Encapsulant dam 32 forms a barrier around the LESDs 22 such that when an encapsulant is applied over the LESDs, it is contained in a confined space. The encapsulant dam 32 may encircle a single conductive feature or multiple conductive features. Optionally, the encapsulant dam material may be reflective to enhance the light output of the LESD. Suitable materials for forming the encapsulant dam include, but are not limited to, electrically insulating materials such as white paste (e.g., heat curable), preformed white plastic, and materials that are also thermally conductive, including but not limited to polymers, gels, glues, e.g., epoxy that is shaped when applied to the article. The height of the encapsulant dam is typically about 50 to about 700 um, but may be any suitable height. A reflective layer 34 may also be applied over the first major surface of the dielectric layer (and over any intervening layers and features such as circuit traces and conductive features). The reflective layer 34 may be adhered with a suitable adhesive 36 or may be attached in any other suitable manner. Suitable materials for the reflective layer include, but are not limited to, enhanced spectral reflective materials such as those available under the trade designation VIKUITI from 3M Company, USA; and white reflective materials such as white epoxy reflective covercoats and white soldermasks.

Figure 6:
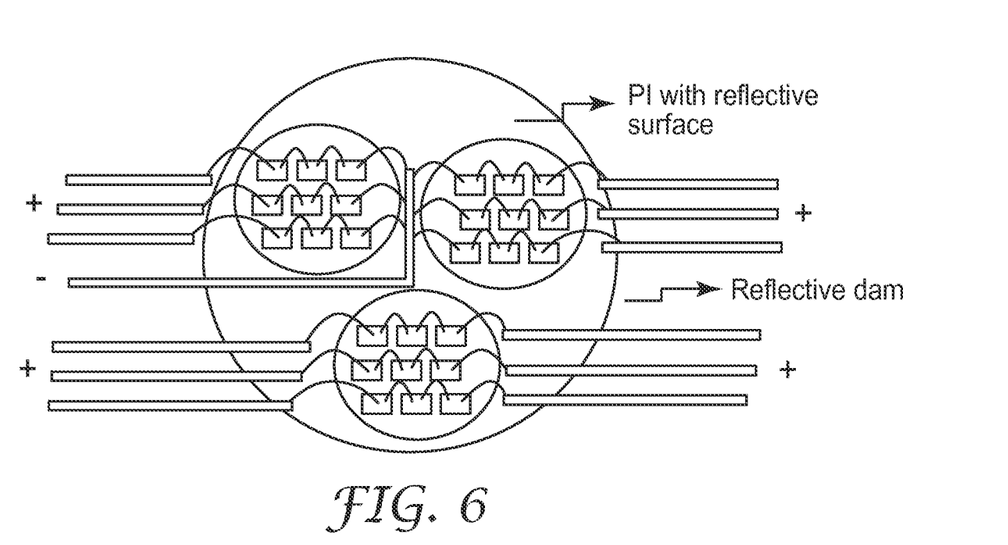
FIG. 6 is a top view of an exemplary embodiment of a flexible LESD according to an aspect of the present invention.
Figure 7:
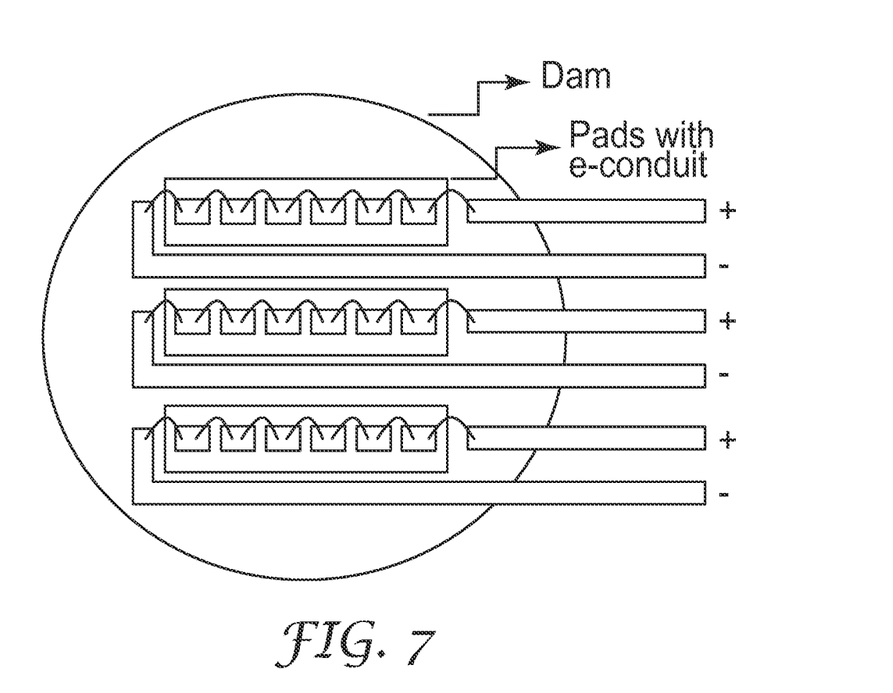
FIG. 7 is a top view of an exemplary embodiment of a flexible LESD according to an aspect of the present invention.

In at least some embodiments of the present invention, the arrays can be grouped together. For example, FIG. 6 illustrates an embodiment in which three circular conductive features are grouped on a reflective surface and inside a circular reflective dam. In this embodiment, each conductive feature supports an array of LESDs and the color of the arrays are different from each other. For example, one array is blue, one is green, and one is red. FIG. 7 illustrates another embodiment in which three rectangular conductive features are aligned within a circular dam.

In at least one embodiment of the present invention, a conductive layer, similar to conductive layer 20, is located on the bottom surface of the dielectric substrate. This conductive layer may be a portion of an electrical circuit formed using conventional flexible circuit manufacturing processes. The circuit may be pre-patterned, or may be patterned during the process of making the flexible LES devices. Alternatively, the conductive layer may function primarily as a heat transfer or heat dissipation element. The conductive layer may comprise any suitable material, but is typically copper.

A conductive layer on the second major surface of the dielectric substrate may be any suitable thickness. Making this conductive layer thick, e.g., about 35 micrometers (um), preferably about 50 um, about 75 um, about 100 um or more may enhance heat removal from the LESDs.

Suitable conductive matter for use in the conductive layers of the present invention will depend on the application, but may include, for example, conductive metals such as copper, silver, gold, nickel, aluminum, tin, and alloys thereof; thermally and electrically conductive adhesives, including non-conducting adhesives filled with conductive material, e.g., conductive particles, such that the resulting adhesive is conductive.

Suitable conductive matter for use in the conductive materials of the present invention will also depend on the application, but may include metals such as copper, gold, silver, nickel aluminum, tin, and alloys thereof as well as solders, conductive polymers, and conductive adhesives, including non-conductive polymers and adhesives filled with conductive material, e.g., conductive particles, such that the resulting matter is conductive.

Suitable polymeric materials for use in the flexible polymeric dielectric layer of the present invention include polyesters, polycarbonates, liquid crystal polymers, and polyimides. Polyimides are preferred. Suitable polyimides include those available under the trade names KAPTON, available from DuPont; APICAL, available from Kaneka Texas corporation; SKC Kolon PI, available from SKC Kolon PI Inc, and UPILEX and UPISEL including UPILEX S, UPILEX SN, and UPISEL VT, all available from Ube Industries, Japan. These UPILEX and UPISEL polyimides are made from monomers such as biphenyl tetracarboxylic dianhydride (BPDA) and phenyl diamine (PDA). In at least one embodiment, the thickness of the dielectric layer is preferably 50 micrometers or less.

Conduits may be formed in the dielectric substrates using any suitable method such as chemical etching, plasma etching, focused ion-beam etching, laser ablation, embossing, microreplication, injection molding, and punching. Chemical etching may be preferred in some embodiments. Any suitable etchant may be used and may vary depending on the dielectric substrate material. Suitable etchants may include alkali metal salts, e.g. potassium hydroxide; alkali metal salts with one or both of solubilizers, e.g., amines, and alcohols, such as ethylene glycol. Suitable chemical etchants for some embodiments of the present invention include KOH/ethanol amine/ethylene glycol etchants such as those described in more detail in U.S. Patent Publication No. 2007-0120089-A1, incorporated herein by reference. Other suitable chemical etchants for some embodiments of the present invention include a KOH/glycine etchants such as those described in more detail in U.S. Provisional Patent Application No. 61/409,791, incorporated herein by reference. Subsequent to etching, the dielectric substrates may be treated with an alkaline KOH/potassium permanganate (PPM) solution, e.g., a solution of about 0.7 to about 1.0 wt % KOH and about 3 wt % $KMnO_4$.

The side wall angle resulting from chemical etching varies, and is most dependent on etch rate, with slower etching rates resulting in shallower side wall angles, i.e., closer to 0°. Typical side wall angles resulting from chemical etching are about 5° to 60° from the major plane of the dielectric layer. In at least some embodiments, the wall angles are about 9° to 45°. And in at least some other embodiments, the wall angles are about 25° to 30°. As previously mentioned as an alternative to chemical etching, conduits in the dielectric substrate may be formed by punching, plasma etching, focused ion-beam etching, and laser ablation. With these methods of forming a conduit, the side walls typically have a steeper angle, e.g., up to 90° from the major plane of the dielectric layer. For purposes of this application, a sloped side wall means a side wall that is not perpendicular to the horizontal plane of the dielectric layer. Conduits with sloped sidewalls could also be made using methods such as embossing, microreplication, and injection molding.

At least some embodiments of the flexible LES devices of the present invention provide excellent heat management properties. In at least one aspect, due at least in part to the conductive materials in the conduits, heat generated by the LESDs can be readily transmitted to a thermally conductive layer on the bottom side of the dielectric substrate. In this manner, heat can be readily conducted away from the LESDs.

The LESDs can be packaged directly on the flexible substrate, e.g., by applying an encapsulating material over individual or multiple LESDs and the conductive features on which they are located, or by applying an encapsulant over an array of LESDs and the portion of conductive layer around such LESDs. The encapsulant is preferably a transparent (i.e., having a transmittance over 99%) molding compound. It may optionally be suitable to act as a lens when cured. Silicones and epoxies are suitable encapsulating compounds. It may further contain optical diffusing particles distributed therein. Suitable molding compounds may be purchased, e.g., from Shin-Etsu Chemical Co., Ltd., of Japan and NuSil Silicone Technology of Santa Barbara, Calif. If desired, a wavelength converting material, such as a phosphor coating, may be deposited on top of the LESD prior to encapsulation. An underfill material may optionally be applied prior to encapsulating the LESD. The flexible LES devices may also be enclosed in a waterproof/weatherproof, transparent casing, which may be made from any suitable polymeric transparent material.

The flexible LES devices can be made in a batch process or a continuous process such as a roll-to-roll process that is often used in making flexible circuits. Arrays of LESDs atop conduits can be formed in any desired pattern on the flexible substrate. The arrays of LESDs can then be divided as desired, e.g., singulated into individual arrays, strips of arrays, or groups of arrays, e.g., by stamping or by slitting the substrate. Accordingly, an entire reel of LESDs on a flexible substrate can be shipped without the need for the traditional tape and reel process in which individual LESDs are typically transported in individual pockets of a carrier tape.

Before or after forming individual, strips, or groups of arrays, the flexible LESDs can be attached to an additional substrate, for example by attaching the second major surface of the dielectric layer, or a conductive layer on the second major surface of the dielectric layer, to the additional substrate with a thermally conductive adhesive. The thermally conductive adhesive can further facilitate the transfer of heat away from the LESD. Alternatively, the second major surface of the dielectric layer, or conductive layer on the second major surface of the dielectric layer, may be treated with metals or other materials that will facilitate its adhesion to a substrate. The substrate is preferably thermally conductive, e.g., a rigid or flexible metal strip or foil, such as an aluminum foil, but may be a semiconductor or ceramic substrate, which may or may not be electrically conductive.

The flexible LES devices can be attached to any desired substrate, depending on their intended use. For example, they can be attached to flexible or rigid metal substrates, such as copper or aluminum, heat sinks, dielectric substrates, circuit boards, etc. If the LESD arrays are for use on a circuit board, the flexible LES devices, whether in singulated, strip, or groups form, can be directly attached to an end user's circuit board, thereby eliminating the need for conventional lead frame materials. If the LESD arrays are for use as a lighting strip, they could be enclosed in a waterproof/weatherproof, transparent casing, as described above. If the LESD arrays are in strip or group form, they may be electrically connected to one or more of the other LESD arrays in the strip or group. Additional elements such as Zener diodes and Schottky diodes can also be added to the flexible substrate prior to be division of the flexible LES devices. These elements may also be electrically connected to the LESD arrays.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. This application is intended to cover any adaptations or variations of the preferred embodiments discussed herein. Therefore, it is manifestly intended that this invention be limited only by the claims and the equivalents thereof.

What is claimed is:

1. An article comprising:
   a flexible polymeric dielectric layer having top and bottom major surfaces, the top major surface having a conductive layer thereon, the dielectric layer having at least first, second and third openings through the dielectric layer, each of the first, second and third openings extending from the bottom major surface to the top major surface, the conductive layer comprising first, second and third conductive features substantially aligned with the respective first, second and third openings;
   first, second and third pluralities of light emitting semiconductor devices supported by the respective first, second and third conductive features;
   a single electrically insulative encapsulant dam disposed on the conductive layer and defining lateral boundaries of a laterally confined space, the first, second and third pluralities of light emitting semiconductor devices being encircled by the single electrically insulative encapsulant dam; and
   a single encapsulant disposed in the laterally confined space and encapsulating the first, second and third pluralities of light emitting semiconductor devices,
   wherein the first, second and third pluralities of light emitting semiconductor devices emit different first, second and third colors, respectively.

2. The article of claim 1, wherein the conductive layer has a thickness from the top major surface of the dielectric layer to an upper surface of the conductive layer, a lower surface of each light emitting semiconductor device in the first, second and third pluralities of light emitting semiconductor devices being disposed above and separated from a plane of the top major surface of the dielectric layer by at least the thickness of the conductive layer.

3. The article of claim 1, wherein the first color is blue, the second color is green, and the third color is red.

4. The article of claim 1, wherein the single electrically insulative encapsulant dam is thermally conductive.

5. The article of claim 1, wherein the single electrically insulative encapsulant dam is reflective.

6. The article of claim 1, wherein the first, second and third conductive feature are first, second and third circular conductive features, respectively.

7. The article of claim 1, wherein the first, second and third pluralities of light emitting semiconductor devices comprise first, second and third two-dimensional arrays of light emitting semiconductor devices, respectively.

8. The article of claim 1, wherein the first, second and third conductive features are first, second and third rectangular conductive features, respectively.

9. The article of claim 8, wherein the first, second and third pluralities of light emitting semiconductor devices are first, second and third linear arrays of light emitting semiconductor devices, respectively, arranged along a width of the respective first, second and third rectangular conductive features.

10. The article of claim 8, wherein the single electrically insulative encapsulant dam is a circular dam and the first, second and third rectangular conductive features are aligned within the circular dam.

11. The article of claim 1, wherein each of the first, second, and third openings has at least one lateral dimension of at least about 1 centimeter.

12. The article of claim 1, wherein each of the first, second, and third openings has at least one lateral dimension of at least about 2 centimeters.

13. The article of claim 1, wherein the first, second, and third conductive feature covers the respective first, second, and third openings.

14. The article of claim 1, wherein each of the first, second, and third openings has walls that slope from the bottom major surface toward the top major surface of the dielectric layer at an angle of about 5° to about 60° from a major plane of the dielectric layer.

15. The article of claim 1, wherein the conductive layer comprises a circuit.

16. The article of claim 1 further comprising a second conductive layer on the bottom major surface of the dielectric layer.

17. The article of claim 1, wherein the single electrically insulative encapsulant dam is formed from a heat-curable white paste.

18. The article of claim 1, wherein the single electrically insulative encapsulant dam is formed from a white plastic.

19. The article of claim 1, wherein the single electrically insulative encapsulant dam is a circular dam.

* * * * *